US008970239B2

(12) United States Patent
Gentrup et al.

(10) Patent No.: US 8,970,239 B2
(45) Date of Patent: Mar. 3, 2015

(54) METHODS AND SYSTEMS FOR DETECTING ESD EVENTS IN CABLED DEVICES

(75) Inventors: Myron H. Gentrup, San Jose, CA (US); Icko E. T. Iben, Santa Clara, CA (US); John T. Kinnear, Jr., Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 1026 days.

(21) Appl. No.: 12/891,682

(22) Filed: Sep. 27, 2010

(65) Prior Publication Data

US 2012/0074978 A1  Mar. 29, 2012

(51) Int. Cl.
| | |
|---|---|
| *G01R 31/00* | (2006.01) |
| *G11B 5/455* | (2006.01) |
| *G01R 29/08* | (2006.01) |
| *G11B 5/31* | (2006.01) |
| *G11B 5/60* | (2006.01) |

(52) U.S. Cl.
CPC .............. *G01R 31/001* (2013.01); *G11B 5/455* (2013.01); *G01R 29/0814* (2013.01); *G11B 5/3166* (2013.01); *G11B 5/6094* (2013.01)
USPC .......................... 324/754.19; 324/72; 324/457

(58) Field of Classification Search
USPC .................. 324/72, 72.5, 457, 750.3, 754.19, 324/754.03; 361/212
See application file for complete search history.

(56) References Cited

U.S. PATENT DOCUMENTS

| | | | | |
|---|---|---|---|---|
| 5,164,880 A | * | 11/1992 | Cronin ........................... | 361/220 |
| 5,557,195 A | * | 9/1996 | Schrimpf et al. ............... | 324/72 |
| 5,736,850 A | * | 4/1998 | Legal ....................... | 324/754.07 |
| 6,078,875 A | * | 6/2000 | Jubin et al. ..................... | 702/123 |
| 6,700,385 B2 | * | 3/2004 | Kraz .............................. | 324/457 |
| 6,809,522 B2 | * | 10/2004 | Nguyen ......................... | 324/457 |
| 7,009,404 B2 | | 3/2006 | Wendel et al. | |
| 7,161,772 B2 | | 1/2007 | Iben | |
| 7,375,543 B2 | * | 5/2008 | Ito et al. ..................... | 324/750.3 |
| 7,498,795 B2 | * | 3/2009 | Enta ............................... | 324/66 |
| 7,560,948 B2 | * | 7/2009 | Grund ...................... | 324/762.01 |
| 7,750,658 B2 | * | 7/2010 | Wang ......................... | 324/750.3 |
| 2008/0036037 A1 | * | 2/2008 | Woo et al. ..................... | 257/546 |
| 2009/0167313 A1 | * | 7/2009 | Kraz .............................. | 324/457 |
| 2009/0288864 A1 | | 11/2009 | Iben et al. | |
| 2010/0051692 A1 | * | 3/2010 | Knudson et al. .............. | 235/439 |

(Continued)

FOREIGN PATENT DOCUMENTS

| | | |
|---|---|---|
| EP | 0697757 A1 | 2/1996 |
| EP | 0827252 A2 | 3/1998 |
| WO | WO 02075892 A1 | 9/2002 |

OTHER PUBLICATIONS

Ramanujan et al., "Modeling IC Snapback Characteristics Under Electrostatic Discharge Stress," © 2009 IEEE, IEEE Transactions on Electromagnetic Compatibility, vol. 51, No. 4, Nov. 2009, p. 901-908.

(Continued)

*Primary Examiner* — Hezron E Williams
*Assistant Examiner* — Hoang Nguyen
(74) *Attorney, Agent, or Firm* — Zilka-Kotab, PC

(57) ABSTRACT

An audit device according to one embodiment includes a substrate; at least one test element coupled to the substrate; a connector adapted for coupling the at least one test element to leads of a cable; and a probe for detecting at least one of: voltage across and current through the at least one test element. Additional systems and methods are also presented.

12 Claims, 7 Drawing Sheets

(56) References Cited

U.S. PATENT DOCUMENTS

2010/0079160 A1* 4/2010 Hernandez et al. ........... 324/754
2010/0117674 A1 5/2010 Hernandez

OTHER PUBLICATIONS

Juliano et al., "Accurate wafer-level measurement of ESD protection device turn-on using a modified very fast transmission-line pulse system," IEEE Transactions on Device and Materials Reliability, Jun. 2001, vol. 1, Issue 2, pp. 95-103, abstract only.

Kraz, V., "ESD Problem Diagnostics in IC and PCB Assembly," Conformity Magazine, Apr. 2009, http://conformity.com/artman/publish/printer_feature281.shtml, pp. 1-8.

"White Paper: ESD Phenomena and the Reliability for Microelectronics," 2002 ESD Association, www.esda.org/documents/whitepaper_000.pdf, pp. 1-55.

Smith, D., "High Frequency Measurements Web Page: A Resistive Current Probe," 2000 Douglas C. Smith, http://emcesd.com/tt070100.htm, pp. 1-5.

Smith, D., "Techniques and methodologies for making system level ESD response measurements for troubleshooting or design verification," Journal of Electrostatics, vol. 31, Issues 2-3, Dec. 1993, pp. 215-235, abstract only.

Davidson et al., "Characterisation of electrostatic discharges from insulating surfaces," University of Southampton, Elsevier Science B.V., May 3, 2002, pp. 374-380, abstract only.

Frei et al., "A transient field measurement system to analyze the severity and occurrence rate of electrostatic discharge (ESD)1," Journal of Electrostatics, vol. 44, Issues 3-4, Sep. 1998, pp. 191-203, abstract only.

* cited by examiner

METHODS AND SYSTEMS FOR DETECTING
ESD EVENTS IN CABLED DEVICES

BACKGROUND

The present invention relates to testing systems, and more particularly, this invention relates to systems and methods for detecting electrostatic discharge (ESD) events in cabled devices.

In magnetic storage systems, data is commonly read from and written onto magnetic recording media utilizing magnetic transducers. Data is written on the magnetic recording media by moving a magnetic recording transducer to a position over the media where the data is to be stored. The magnetic recording transducer then generates a magnetic field, which encodes the data into the magnetic media. Data is read from the media by similarly positioning the magnetic read transducer and then sensing the magnetic field of the magnetic media. Some more common magnetic read transducers, such as magnetoresistive (MR) sensors, include anisotropic magnetoresistive (AMR), giant magnetoresistive (GMR), and tunnel valve magnetoresistive (TMR) sensors. Read and write operations may be independently synchronized with the movement of the media to ensure that the data can be read from and written to the desired location on the media.

Additionally, the manufacturing processes for many other devices, such as mobile telephones, laptop computers, handheld global positioning satellite (GPS) systems, any device using a semiconductor, etc., include steps where ESD events may cause damage to sensitive components of the devices. Many of these devices also include cabled components.

ESD is a major cost detractor in manufacturing facilities of MR heads, semiconductor devices, etc. The MR sensors are typically bonded to flexible cables to enable connection to external electronic devices, such as drives, controllers, etc. Similarly, components of mobile telephones and other semiconductor devices include sensitive elements bonded to cables, and sometimes to flexible cables. ESD events occur when currents pass through the MR sensor, or other sensitive components, which may occur due to various circumstances and from multiple sources. For example, ESD events may occur due to handling and use of MR sheet resistors with the build-up of electrostatic charges on the various components of a head or other objects which come into contact with the MR sensors and spontaneously discharge through the MR sensor leading to damage. Static charges may be externally produced and accumulate on instruments used by persons performing device manufacturing or testing functions. These static charges may also discharge through the devices, causing physical and/or magnetic damage to the sensors or other sensitive components.

Currently, engineers measure voltages of the cable or voltages of fixtures, testers, operators, etc., to determine whether there is a risk of ESD damage to the sensitive components of the electronic device. Conventional techniques used to determine risks make use of measurements external to the device to predict whether sufficiently high ESD currents might pass through the MR sensor or other sensitive components. These measurements external to the device are indirect measurements. Another approach that is currently used is to test the heads at various stages in the manufacturing process to determine if the heads are damaged. This also is an indirect measurement of the ESD event, as well as being a very expensive method (due to the cost of the ruined electronic devices once the damage is detected) which gives very little information as to the type, source, extent, etc., of the ESD event which caused the damage.

SUMMARY

An audit device according to one embodiment includes a substrate; at least one test element coupled to the substrate; a connector adapted for coupling the at least one test element to leads of a cable; and a probe for detecting at least one of voltage across and current through the at least one test element.

An audit device according to another embodiment includes a printed circuit board (PCB); at least one test element coupled to the PCB, wherein the at least one test element is a resistor or a resistance-inductance-capacitance (RLC) circuit having an equivalent circuit value to a device that is normally connected to a cable and for which electrostatic discharge (ESD), electrostatic overstress (EOS), and/or cable discharge event (CDE) characteristics are desired to be determined, and wherein the equivalent circuit value is selected from a group consisting of inductance, capacitance, resistance, and impedance; a connector adapted for coupling the at least one test element to leads of the cable; a probe for detecting at least one of: voltage across or current through the at least one test element; and a microprocessor or an oscilloscope coupled to the probe for collecting data from the probe, wherein the data collected from the probe includes at least one of: signal pulse waveform during a time period, signal magnitude, signal pulse width, polarity, and frequency of events.

A method according to one embodiment includes coupling an audit device to a cable, wherein the audit device includes a test element that is coupled to a first signal line and a second signal line or a ground; and measuring a circuit value through the test element using a probe adapted for detecting at least one of: voltage across or current through the test element.

Other aspects and embodiments of the present invention will become apparent from the following detailed description, which, when taken in conjunction with the drawings, illustrate by way of example the principles of the invention.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of tape-based storage systems, as well as production, operation and/or component parts thereof.

In one general embodiment, an audit device includes a substrate; at least one test element coupled to the substrate; a connector adapted for coupling the at least one test element to leads of a cable; and a probe for detecting at least one of: voltage across and current through the at least one test element. By measuring both voltage across and current through a test element, one can determine complex impedance of the test element, which can include resistive, inductive and capacitive properties among others.

In another general embodiment, an audit device includes a printed circuit board (PCB); at least one test element coupled to the PCB, wherein the at least one test element is a resistor or a resistance-inductance-capacitance (RLC) circuit having an equivalent circuit value to a device that is normally connected to a cable and for which electrostatic discharge (ESD), electrostatic overstress (EOS), and/or cable discharge event (CDE) characteristics are desired to be determined, and wherein the equivalent circuit value is selected from a group consisting of: inductance, capacitance, resistance, and impedance; a connector adapted for coupling the at least one test element to leads of the cable; a probe for detecting at least one of: voltage across or current through the at least one test element; and a microprocessor or an oscilloscope coupled to the probe for collecting data from the probe, wherein the data collected from the probe includes at least one of: signal pulse waveform during a time period, signal magnitude, signal pulse width, polarity, and frequency of events.

In another general embodiment, a method includes coupling an audit device to a cable, wherein the audit device includes a test element that is coupled to a first signal line and a second signal line or a ground; and measuring a circuit value through the test element using a probe adapted for detecting at least one of: voltage across or current through the test element.

Figure 1:
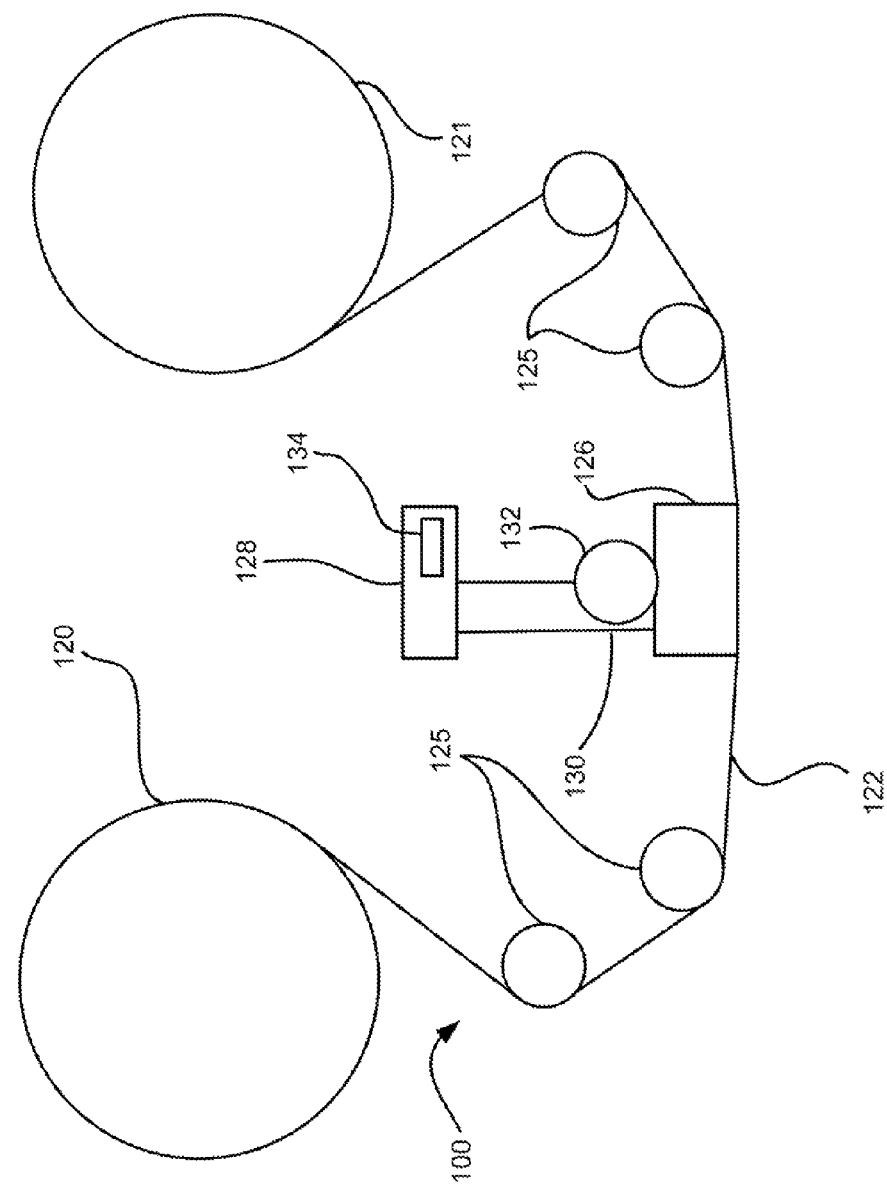
FIG. 1 is a schematic diagram of a simplified tape drive system according to one embodiment.

FIG. 1 illustrates a simplified tape drive 100 of a tape-based data storage system, which may be employed in the context of various embodiments described herein. While one specific implementation of a tape drive is shown in FIG. 1, it should be noted that the embodiments described herein may be implemented in the context of any type of tape drive system.

As shown, a tape supply cartridge 120 and a take-up reel 121 are provided to support a tape 122. One or more of the reels may form part of a removable tape cartridge and are not necessarily part of the system 100, according to some approaches. The tape drive 100, such as that illustrated in FIG. 1, may further include drive motor(s) to drive the tape supply cartridge 120 and the take-up reel 121 to move the tape 122 over a tape head 126. The tape head 126 may be of any type, as known to one of skill in the art.

Guides 125 may position the tape 122 across the tape head 126. The tape head 126 is in turn coupled to a controller assembly 128, possibly via a cable 130. The controller 128 typically controls head functions such as servo following, writing, reading, etc. The cable 130 may include read/write circuits to transmit data to the head 126 to be recorded on the tape 122 and to receive data read by the head 126 from the tape 122. An actuator 132 controls positioning of the head 126 relative to the tape 122.

An interface 134 may also be provided for communication between the tape drive 100 and a host (integral or external, not shown in FIG. 1) to send and receive the data and for controlling the operation of the tape drive 100 and communicating the status of the tape drive 100 to the host, as would be apparent to one of skill in the art upon reading the present descriptions.

Figure 2A:
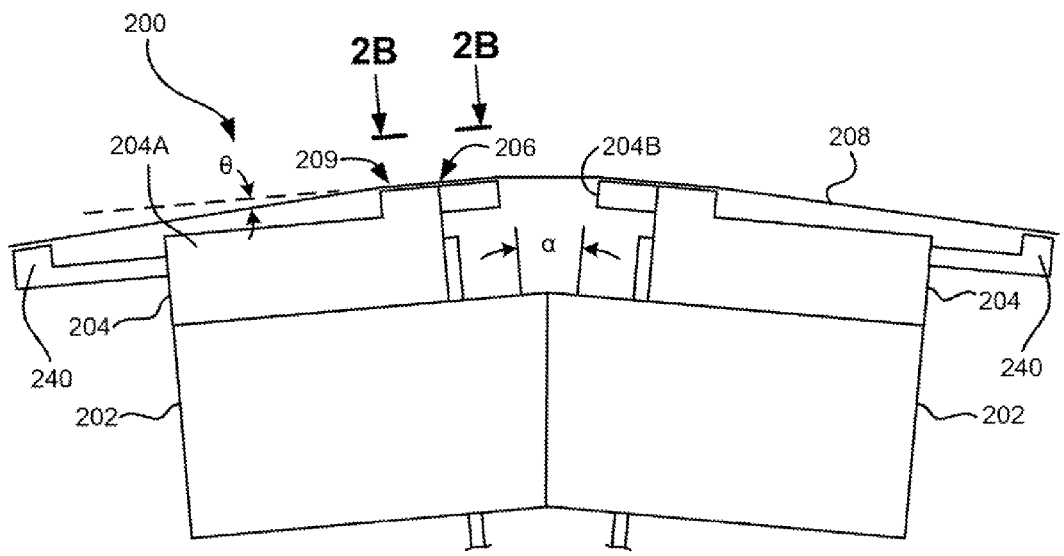
FIG. 2A illustrates a side view of a flat-lapped, bi-directional, two-module magnetic tape head according to one embodiment.

By way of example, FIG. 2A illustrates a side view of a flat-lapped, bi-directional, two-module magnetic tape head 200 according to one embodiment. As shown, the head 200 includes a pair of bases 202, each equipped with a module 204, and fixed at a small angle α with respect to each other. The bases 202 are typically "U-beams" that are adhesively coupled together. Each module 204 includes a substrate 204A and a closure 204B with a gap comprising elements 206 such as readers, writers, and/or servos situated therebetween. In use, a tape 208 is moved over the modules 204 along a media (tape) bearing surface 209, also known as a tape bearing surface (TBS), in the manner shown for reading and/or writing data on the tape 208 using the readers and/or writers. The wrap angle θ of the tape 208 at edges going onto and exiting the flat media support surfaces 209 may be between ⅛ A degree and 4¼ degrees, according to various embodiments. The modules 204 may also include one or more outriggers 240 that may extend from the modules 204, and which may guide the tape 208 across the TBS, according to some embodiments. The outriggers 240 may be present on either side of the magnetic tape head 200 in a tape travelling direction, according to some approaches. Additionally, the outriggers 240 may help to guide the tape 208 to a desired wrap angle θ.

The substrates 204A are typically constructed of a wear resistant material, such as a ceramic, alumina-titanium carbide ($Al_2O_3$—TiC, herein referred to as AlTiC), alumina, etc. The closures 204B may be made of the same or similar materials as the substrates 204A, or may be constructed of different materials exhibiting good wear resistant characteristics, according to more approaches.

The readers and/or writers may be arranged in a piggyback configuration, in one embodiment. The readers and/or writers may also be arranged in an interleaved configuration, in another embodiment. Alternatively, each array of channels may be readers or writers only. Any of these arrays may include one or more servo readers.

Figure 2B:
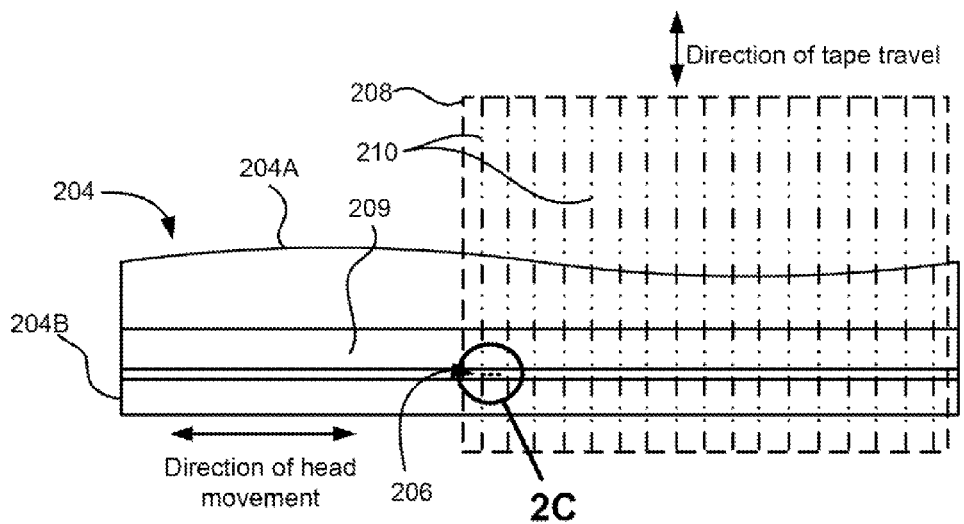
FIG. 2B is a tape bearing surface view taken from Line 2B of FIG. 2A.

FIG. 2B illustrates the TBS 209 of one of the modules 204 taken from Line 2B of FIG. 2A. A representative tape 208 is shown in dashed lines. The module 204 may preferably be long enough, in one approach, to support the tape 208 as the head 200 steps between data bands, as shown between the dashed lines representing servo tracks 210 along the travelling direction of the tape 208.

In this example, the tape 208 includes anywhere from 4-22 data bands, e.g., 16 data bands with 17 servo tracks 210, as shown in FIG. 2B on a one-half inch wide tape 208. The data bands are defined between servo tracks 210. Each data band may include a number of data tracks, for example 64 data tracks, 96 data tracks, 128 data tracks, etc. (not shown). During read/write operations, the elements 206 are positioned within one of the data bands. Outer readers, sometimes called servo readers, read the servo tracks 210. The servo signals are in turn used to keep the elements 206 aligned with a particular track during the read/write operations.

Figure 2C:
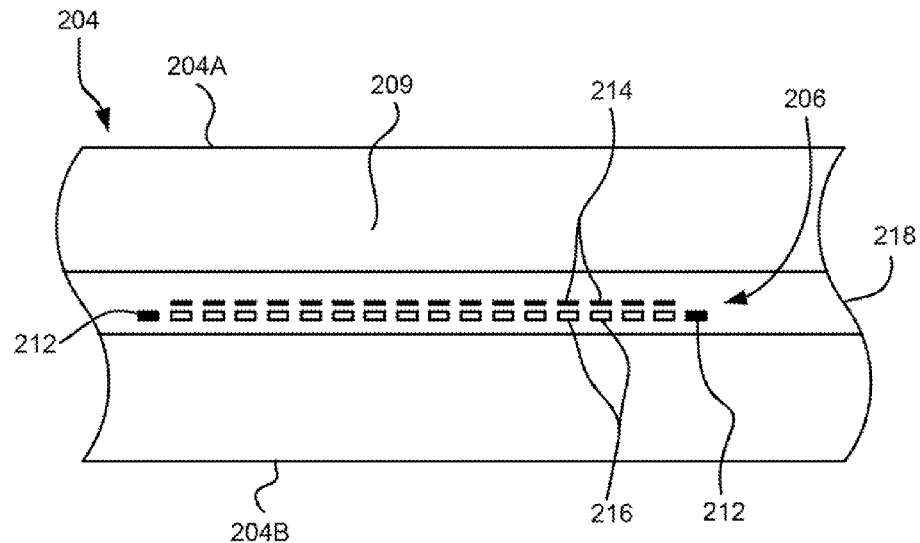
FIG. 2C is a detailed view taken from Circle 2C of FIG. 2B.

FIG. 2C depicts a plurality of read and/or write elements 206 formed in a gap 218 of the module 204 taken from Circle 2C of FIG. 2B. As shown, the array of elements 206 includes, for example, 16 writers 214, 16 readers 216, and two servo readers 212, though the number of elements may vary, according to various embodiments. Illustrative embodiments include 8, 16, 32, and 64 elements 206 per array. A preferred embodiment includes 32 readers per array and/or 32 writers per array. This allows the tape to travel more slowly, thereby reducing speed-induced tracking and mechanical difficulties, as well as reducing wear. While the readers 216 and writers 214 may be arranged in a piggyback configuration as shown in FIG. 2C, the readers 216 and writers 214 may also be arranged in an interleaved configuration or any other configuration as would be known to one of skill in the art. Alternatively, each array of elements 206 may be readers or writers only, and the arrays may contain one or more servo readers 212. As noted by considering FIGS. 2A-2C together, each module 204 may include a complementary set of elements 206 for such things as bi-directional reading and writing, read-while-write capability, backward compatibility, etc.

Figure 2D:
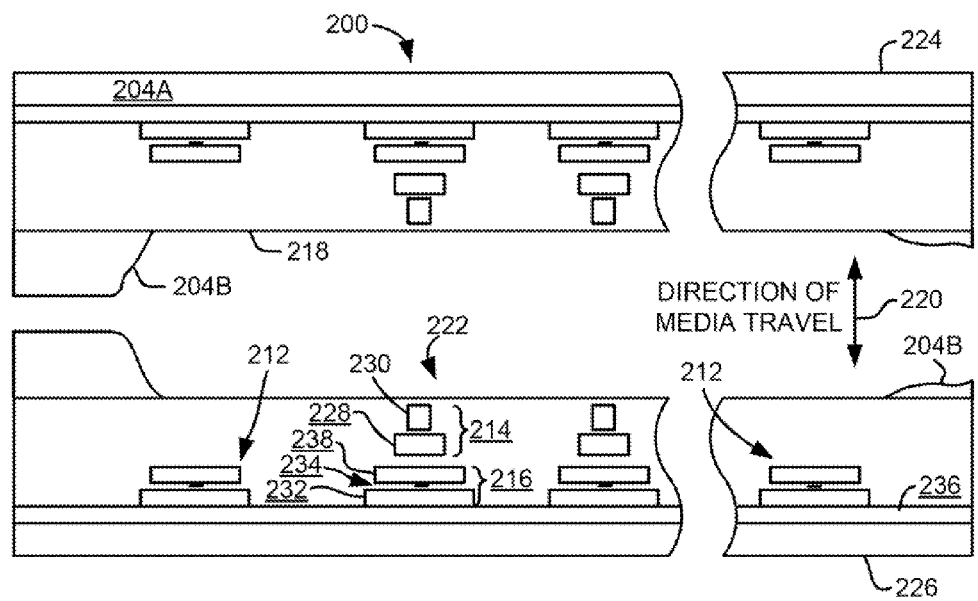
FIG. 2D is a detailed view of a partial tape bearing surface of a pair of modules.

FIG. 2D shows a partial tape bearing surface view of complimentary modules of a magnetic tape head 200 according to another embodiment. In this embodiment, each module has a plurality of read/write (R/W) pairs in a piggyback configuration formed on a common substrate 204A and an optional electrically insulative layer 236. The writers, exemplified by the write head 214 and the readers, exemplified by the read head 216, are aligned parallel to a direction of travel of a tape medium thereacross to form an R/W pair, exemplified by the R/W pair 222.

Several R/W pairs 222 may be present, such as 8, 16, 32 pairs, etc. The R/W pairs 222 as shown are linearly aligned in a direction generally perpendicular to a direction of tape travel thereacross. However, the pairs may also be aligned diagonally, parallel, etc. Servo readers 212 may be positioned on the outside of the array of R/W pairs, the function of which has previously been described.

Generally, the magnetic tape medium moves in either a forward or reverse direction as indicated by arrow 220. The magnetic tape medium and head assembly 200 operate in a transducing relationship in a manner well-known in the art. The piggybacked magnetoresistive (MR) head assembly 200 includes two thin-film modules 224 and 226 of generally identical construction, according to one embodiment.

Modules 224 and 226 may be joined together with a space present between closures 204B thereof (partially shown) to form a single physical unit to provide read-while-write capability by activating the writer of the leading module and reader of the trailing module aligned with the writer of the leading module parallel to the direction of tape travel relative thereto. When a module 224, 226 of a piggyback head 200 is constructed, layers are formed in the gap 218 created above an electrically conductive substrate 204A (partially shown), e.g., of AlTiC, in the following order in one embodiment for the R/W pairs 222: an insulating layer 236, a first shield 232 typically of an iron alloy such as NiFe (permalloy), CZT or Al—Fe—Si (Sendust), a sensor 234 for sensing a data track on a magnetic medium, a second shield 238 typically of a nickel-iron alloy (e.g., 80/20 Permalloy), first and second writer pole tips 228, 230, and a coil (not shown).

The first and second writer poles 228, 230 may be fabricated from high magnetic moment materials such as 45/55 NiFe, in one approach. Note that these materials are provided by way of example only, and other materials may be used. Additional layers such as insulation between the shields and/or pole tips, an insulation layer surrounding the sensor, lubricating layers, overcoat layers, etc., may also be present. Illustrative materials for the insulation layers include alumina and other oxides, insulating polymers, etc.

According to one embodiment, a method and/or system is described for directly measuring at least the current and voltage which pass through an MR sensor during a manufacturing process for a magnetic head in order to detect conditions that may result in electrostatic discharge (ESD), electrostatic overstress (EOS), and cable discharge events (CDEs). In one approach, an ESD Probe (which may be a fixed resistor and accompanying circuitry) of an audit device may be attached at an end of a cable in place of the MR sensor, and a current/voltage probe may be attached to the resistor. Once this arrangement is in place, the cable may be processed with the ESD Probe through the circuit and multiple measurements may be taken at any stage in the process to develop a direct measurement of the current/voltage levels and pulse shapes which may pass through the MR sensor if it was in place in the head. Since the ESD Probe is not damaged by these events, it may be reused to collect distributions of the current/voltage levels of this head over time, as well as being able to be placed on heads which are subsequently manufactured.

According to one embodiment, a backplane element, such as a substrate, wafer, printed circuit board (PCB), etc., may be produced with connections which may be wire bonded, soldered, etc., to a cable. For sake of clarity, for the remainder of the disclosure, this backplane element is referred to as a PCB. The PCB may include sockets designed to allow a user to connect resistors of desired resistance values to the PCB in a way such that they are easily removed and replaced with resistors of different resistance values. The resistors may be selected based on characteristics of the MR sensors, head, or sensitive components in which the PCB is being used to detect current/voltage. The resistors may be connected across any two leads of a cable. A current probe may be passed through the leads of the resistor to measure the current through the resistor. The current probe may also be connected to an oscilloscope or other such device which may be triggered to record pulses if a current pulse passes through the resistor.

According to one embodiment, the PCB (or other backplane element, as previously described) may have dimensions such that the cabled PCB (CPCB) is capable of passing through the manufacturing process without interrupting any subsequent build steps, e.g., it is designed and placed in a location relative to the head that does not interfere with any other components of the head. Current may be detected, registered, recorded, and/or reported at any point during the build process. More sophisticated PCBs may be made which include integrated circuits which may be mounted on the PCB and have the capability of measuring current and/or voltage data, such as maximum voltage/current, frequency of voltage/current signal pulses in a given range, voltage/current signal pulse waveform during a time period (e.g., between a time t1 and a time t2, with time intervals of dt), pulse width of the voltage/current pulse, Fourier frequency content of the pulse, etc. Other information which may be collected includes signal magnitude, signal polarity, frequency of ESD events, EOS events, and/or CDEs, etc. Note that such a device can be constructed to enable auditing of any type of cable and/or cabled device. Examples include, but are not limited to, cabled MR sensors used in the data storage industry for hard disk drives (HDD), tape drives, etc.; a cabled semiconductor device; a cabled diode laser, LED, etc. Many other such devices may benefit from an audit device to determine where in the assembly line ESD events, EOS events, and CDEs may be occurring, as would be known to one of skill in the art.

Figure 3:
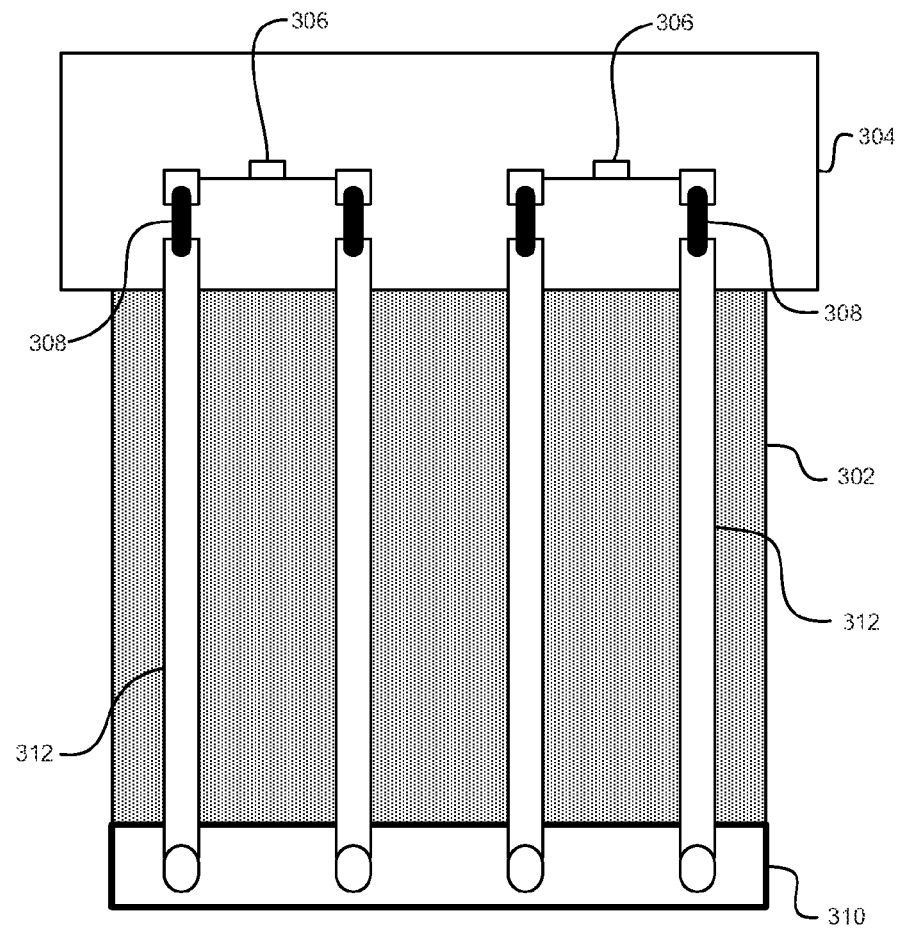
FIG. 3 is a schematic diagram of a wafer device connected to a cable, according to the prior art

Now referring to FIG. 3, a schematic diagram of a wafer device 304 connected to a cable 302 is shown, according to the prior art. Any number of cable leads 312 may be present in the cable 302. The multiple devices 306 on the wafer device 304 and their lead connections 308 (which may be wire bond leads, in one approach) do not allow for a current/voltage probe to be connected thereto. Accordingly, in the prior art, ESD events, EOS events, and CDEs are indirectly inferred by monitoring at the cable connector end 310. Measuring at the cable connector end 310 has several drawbacks: 1) it is not a direct measurement of conditions that occur at the device end of the cable; 2) the electrical circuit is changed dramatically to perform the measurements; and 3) the conditions causing the ESD events, EOS events, and CDEs may not be possible to measure (possibly due to the cable being connected to an external device when the process of making the connection may be the source of the ESD events, EOS events, and/or CDEs). Furthermore, even if a probe is connected to measure the current through or voltage across an MR device at the location where the MR device is connected to the cable, since MR devices are very sensitive to ESD, EOS and CDEs, they cannot be used repetitively since once they are damaged, their electrical characteristics are changed, and they would need to be replaced after being damaged.

Figure 4:
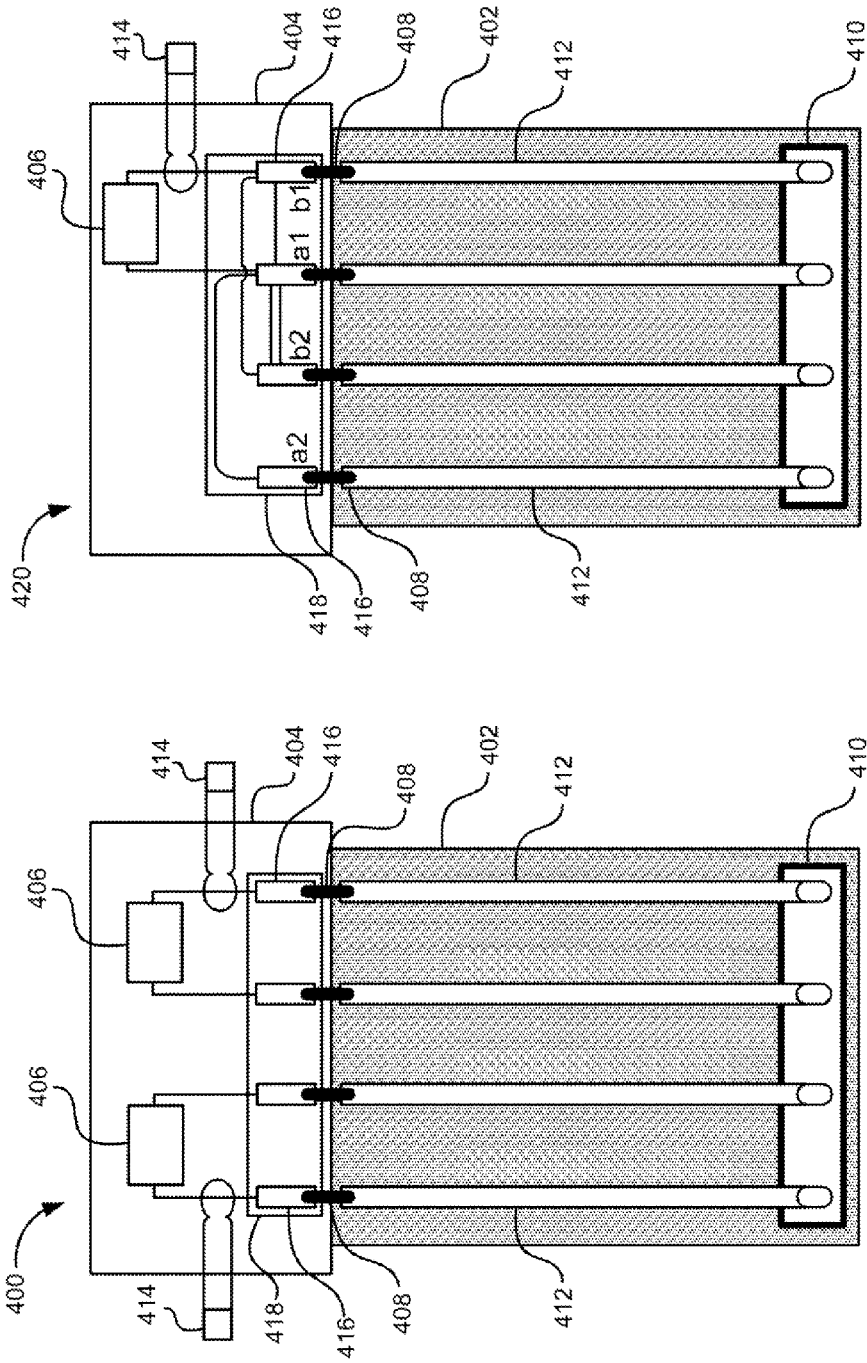
FIG. 4A is a schematic diagram of an audit device connected to a cable, according to one embodiment.
FIG. 4B is a schematic diagram of an audit device connected to a cable, according to one embodiment.

In FIG. 4A, a schematic diagram of an audit device 400 connected to a cable 402 is shown in a location similar to that used for conventional devices on a wafer substrate (not shown), according to one embodiment. The audit device 400 may comprise a PCB 404 for ease of installation, ease of construction, durability, etc., onto which various components may be coupled. In the embodiment shown, a probe 414 is used to measure each test element or test device under test (DUT) 406. Each test element 406 that is used may be different from the actual device to be tested, especially when the test element 406 is used for complex and/or highly sensitive devices under test. The test element 406, may, however, reproduce an equivalent circuit value, for each circuit value under test, of the wafer device, such as inductance, capacitance, resistance, etc., in a desired range. Optimally, the test element 406 may be very robust against ESD damage so that it may be used repeatedly without sustaining ESD/EOS/CDE damage.

As can be seen in FIG. 4A, a plurality of test elements 406 are used, and each of the plurality of test elements 406 is coupled to a unique pair of leads 416 of a connector 418. Also, leads 416 may be coupled to lead connections 408 (which may be wire bond leads, in one approach), which may be coupled to cable leads 412, in one embodiment. A cable connector 410 may also be included for connection to external electronic devices and circuits, in one approach.

In some embodiments, the test element 406 may be a dummy element, an actual device element under test, a mobile telephone chip, a computer chip, a semiconductor, a device undergoing immunity testing, etc.

Also, in some approaches, the cable 402 may be a flexible cable or any other type of cable as would be apparent to one of skill in the art.

According to one embodiment, an audit device 400 may include a PCB 404, at least one test element 406 coupled to the PCB 404, a connector 418 adapted for coupling the at least one test element 406 to leads of a cable 402, and a probe 414 for detecting at least one of: voltage, current, impedance, inductance, capacitance, and resistance coupled to the at least one test element 406. The PCB may be on a rigid board or a flexible cable structure which has the desired electrical layout printed on it, according to various embodiments.

According to one embodiment, the audit device 400 may also include a microprocessor or an oscilloscope coupled to the probe 414 for collecting data from the probe 414. Any type of microprocessor or oscilloscope may be used, such as a high speed oscilloscope, field programmable gate array (FPGA), application specific integrated circuit (ASIC), central computing unit (CPU), etc. In some approaches, the microprocessor or oscilloscope may be positioned on the PCB 404. In other approaches, it may be coupled to the PCB 404, and located elsewhere, possibly due to space concerns.

In another approach, the data collected from the probe 414 may include any data as known in the art, such as: signal magnitude, signal pulse width, polarity, frequency of current or voltage pulses associated with ESD events, EOS events, and/or CDEs, etc. Of particular concern is data that would allow for prediction and/or correction of ESD events, EOS events, and/or CDEs.

In yet another approach, the at least one test element 406 may be a resistor or a resistance-inductance-capacitance (RLC) circuit having an equivalent circuit value matching or approximating an impedance of the device under test (DUT). For example, if an MR sensor in a magnetic head is the DUT, and the MR sensor has a resistance of about 100Ω, then the test element 406 may be selected to also have a resistance of about 100Ω. In a further embodiment, the equivalent circuit value may be any circuit value as known in the art, such as: inductance, capacitance, resistance, a general complex impedance, $Z=R+jX$, where R and X are real numbers and $j=sqrt(-1)$, etc. An ideal resistor has an R and $X=0$. An ideal inductor has $R=0$ and $X=w*L$, where L is the inductance, w is $2*\pi*$frequency. An ideal capacitor has an $R=0$ and an $X=-1/(w*C)$, where C is the capacitance. Actual devices have both real (R) and imaginary (X) components.

A circuit value, according to various embodiments, may include, but is not limited to, inductance, capacitance, resistance, impedance, etc.

In additional embodiments, the at least one test element 406 may be tunable such that the at least one test element 406 is capable of matching the complex impedance of the DUT with an equivalent circuit value in a predetermined frequency range. Further, the frequency range may be determined based on a frequency range where ESD events, EOS events, and/or CDEs are anticipated to occur.

An example of a tunable circuit includes having N resistors of values: R1, R2, . . . , Rn, which may all be connected in parallel, and each resistor has a relay switch to either connect it into or out of the parallel circuit. In this way, any combination of the parallel connections may be made. For example, a two resistor circuit may have resistance values of R1, R2 or R1*R2/(R1+R2). With R2=2*R1, the possible values include: 0.67*R1, R1 and 2*R1, for example. Of course, any arrangement of resistors and resistance values may be used, as would be apparent to one of skill in the an upon reading the present descriptions.

According to one particular embodiment, the at least one test element 406 may be the DUT. For example, in the previous example of a magnetic head, the test element 406 may be the MR sensor. This, of course, would subject the MR sensor to any dangerous conditions that are trying to be prevented. However, it would also provide the most accurate data for prevention of future events from occurring.

In one approach, the PCB 404 may be coupled to the cable 402.

Now referring to FIG. 4B, an audit device 420 is shown according to another embodiment. The audit device 420 is shown coupled to a cable in a similar location as a conventional device would be on a wafer substrate (not shown). The audit device 420 includes a different connection/use than the audit device 400 shown in FIG. 4A. As shown in FIG. 4B, the leads 416 are labeled individually. Of course, each of these leads 416 may be labeled in any way, and are not limited to any labeling scheme disclosed herein.

Referring again to FIG. 4B, leads a1 and a2, . . . , leads b1 and b2, . . . , etc., are connected together in a "daisy chain" fashion. A single test element 406 is connected across a1 and a2, and the probe 414 measures between a1 and a2. That is, one test element 406 is coupled to all leads 416 of the connector 418, the leads 416 of the connector 418 being coupled in a daisy-chain fashion to each other such that the one test element 406 is connected across each pair of leads of the cable 402 when the cable 402 is coupled to the connector 418.

In this manner, if there is an ESD event, EOS event, and/or CDE from any of the cable leads 412, the probe 414 detects it. This enables detecting rare events from many potential contact points using a single probe 414, which reduces complexity, production issues, installation issues, cost, etc.

According to various embodiments, the probe 414 may be coupled to the PCB 404, the cable 402, or any other device as would be known to one of skill in the art.

In one example, one test element may be coupled to a group of leads of the connector, all positive polarity leads of the group of leads may be coupled together on the substrate, and all negative polarity leads of the group of leads may be coupled together on the substrate such that the test element is coupled across the positive and the negative coupled leads of the group of leads of the connector, and the test element is coupled across pairs of leads of the cable when the cable is coupled to the connector.

Figure 5:
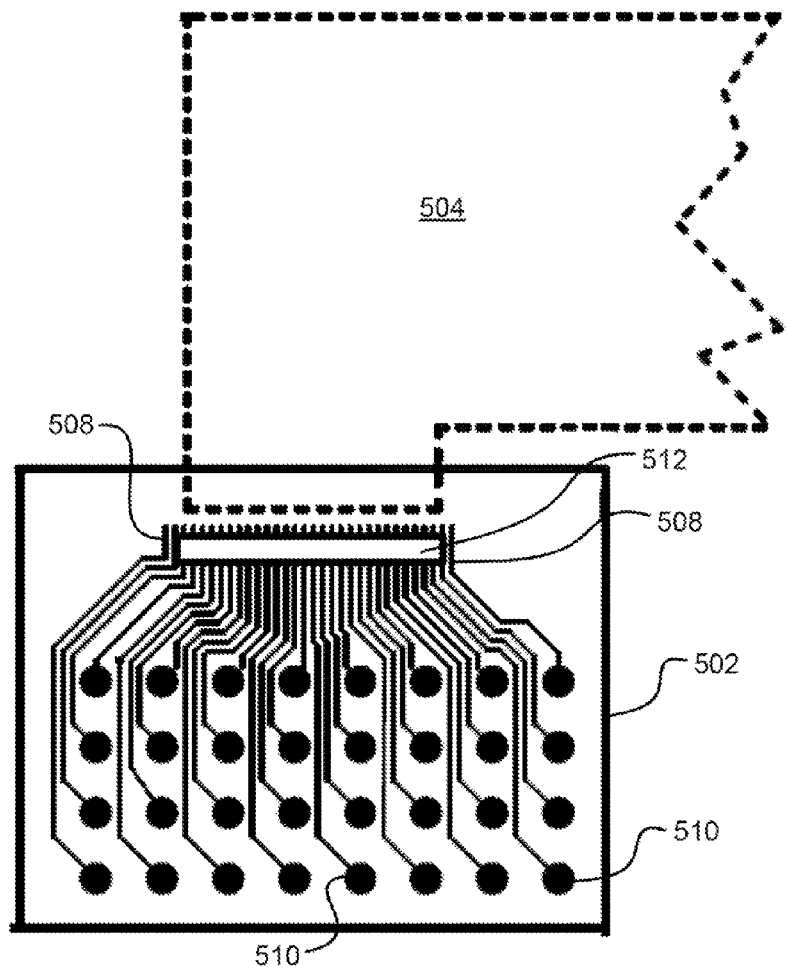
FIG. 5 is a schematic diagram of a PCB and a cable, according to one embodiment.

FIG. 5 shows a schematic diagram of a PCB 502 and a cable 504, according to one embodiment. The PCB 502 may be used to simulate a module holding an MR sensor, according to one approach. In additional approaches, the PCB 502 may be used to simulate any electronics device which is susceptible to damage from ESD events, EOS events, and/or CDEs, according to various embodiments.

According to some approaches, a Flex cable 504 may be used with a Flex PCB 502 coupled to one end of the cable 504, where the PCB 502 is used to detect ESD, EOS, and/or CDE conditions (such as voltage/current) at the end of the cable 504 where the actual devices are coupled. The Flex PCB 502 may be glued to the Flex cable 504, adhered to the Flex cable 504, or detachably coupled to the Flex cable 504, according to various embodiments. Wire connections (not shown) on the Flex cable 504 may be wire bonded to wire connections 508 on the Flex PCB 502, according to some approaches. In addition, sockets may be soldered to large bonding pads 510 on the Flex PCB 502 and resistors may be mounted into the sockets with a current probe passing through the wires connected to the resistor, in another approach. Diode protection 512, e.g., crossed-diodes connected in parallel with one another and with a resistor element may be connected across pairs of conductors in each circuit. The crossed diodes may be used to prevent ESD, EOS, and/or CDE damage. In some embodiments, the audit device may be used to detect ESD events, EOS events, and/or CDEs with diodes and resistors in the PCB circuitry in order to determine the current levels which pass through the resistors and which pass through the diodes to determine the effectiveness of the diodes in protecting the devices which the resistors are used to simulate (e.g., MR sensors).

Figure 6:
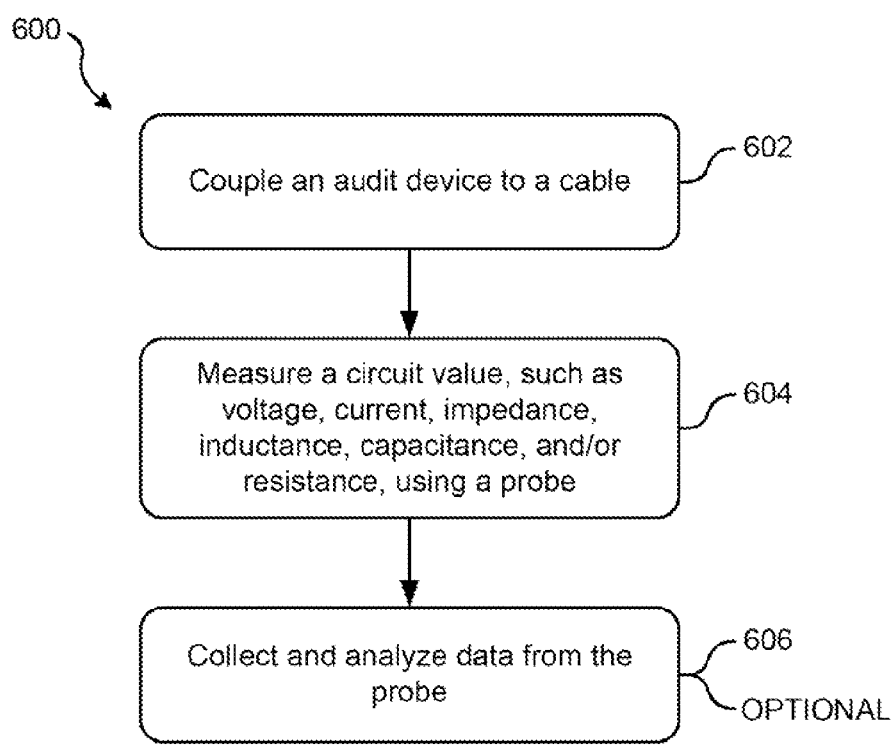
FIG. 6 is a flowchart of a method, according to one embodiment.

Now referring to FIG. 6, a method 600 is shown according to one embodiment. The method 600 may be carried out in any desired environment, including those shown in FIGS. 1-5, according to various embodiments. The method 600 may include more or less operations than are shown in FIG. 6, as would be apparent to one of skill in the art upon reading the present descriptions.

In operation 602, an audit device is coupled to a cable. The audit device includes a test element that is coupled to a first signal line and a second signal line or a ground. The test element may be used to simulate an equivalent circuit value from a device under test. For example, if the audit device is being used to audit a magnetic head, the test element may simulate a circuit value of one or more MR sensors in the magnetic head. Possible circuit values include, but are not limited to, inductance, capacitance, resistance, and other complex impedances.

In operation 604, a circuit value is measured through the test element using a probe adapted for detecting at least one of: voltage across or current through the test element. The measured circuit value may be an indicator of conditions that may lead to undesired events in an electronic device coupled to the cable, such as ESD events, EOS events, and CDEs.

In optional operation 606, data is collected from the probe. The data may be of any type known in the art, such as signal magnitude, signal pulse width, polarity, frequency of events (such as ESD events, CDEs, and EOS events), etc. This collected data may be sent to a microprocessor or some other device capable of interpreting the data and producing information useable by an operator when running a production process, such as a production process for magnetic heads.

According to one embodiment, the cable may be a flexible cable for use with a magnetic sensor in a magnetic data storage drive for reading data from a magnetic medium, such as magnetic tape, magnetic hard disk, magnetic floppy disks, etc. In this embodiment, the audit device may be coupled to the flexible cable, possibly with glue or mechanical fasteners, thereby allowing for coupling of the test elements to cable leads.

In another approach, the cable may be coupled to a connector of the magnetic head. The connector may be of any type, such as USB, RJ45, RS232, etc.

According to one embodiment, the test element may be a DUT, and the method 600 may include performing ESD immunity testing on the test element, such as in conjunction with European Conformity (CE mark) testing.

In another embodiment, the method 600 may include measuring placement of devices using surface mount technology (SMT) placement equipment. These placement measurements may be performed while the SMT equipment is in operation to ensure proper placement of devices.

Having described and illustrated the principles of this application by reference to one or more preferred embodiments, it should be apparent that the preferred embodiment(s) may be modified in arrangement and detail without departing from the principles disclosed herein and that it is intended that the application be construed as including all such modifications and variations insofar as they come within the spirit and scope of the subject matter disclosed herein.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. An audit device, comprising:
a substrate;
a plurality of test elements coupled to the substrate;

a connector configured to couple each of the test elements to a unique pair of leads of a cable; and a probe coupled to each of the test elements for detecting at least one of: voltage across and current through each of the test elements;

wherein a microprocessor or oscilloscope is physically on the substrate.

2. An audit device as recited in claim 1, further comprising the microprocessor or oscilloscope coupled to the probes for collecting data from the probes.

3. An audit device as recited in claim 2, wherein the data collected from the probes includes at least one of: current or voltage signal pulse waveform during a time period, signal magnitude, signal pulse width, signal polarity, and frequency of events.

4. An audit device as recited in claim 1, wherein each of the test elements is a resistor or a resistance-inductance-capacitance (RLC) circuit having an equivalent circuit value to a device under test.

5. An audit device as recited in claim 4, wherein the equivalent circuit value is selected from a group consisting of: inductance, capacitance, resistance, and impedance.

6. An audit device as recited in claim 5, wherein each of the test elements is tunable such that each of the test elements is capable of matching the equivalent circuit value in a predetermined frequency range.

7. An audit device as recited in claim 6, wherein the frequency range is determined based on a frequency range where electrostatic discharge (ESD) events or electrostatic overstress (EOS) events or cable discharge events (CDEs) are anticipated to occur.

8. An audit device as recited in claim 1, wherein each of the test elements is a device under test.

9. An audit device as recited in claim 1, wherein the substrate is coupled to the cable.

10. An audit device, comprising:
a printed circuit board (PCB);
at least one test element coupled to the PCB, wherein the at least one test element is a resistor or a resistance-inductance-capacitance (RLC) circuit having an equivalent circuit value to a device that is normally connected to a cable and for which electrostatic discharge (ESD), electrostatic overstress (EOS), and/or cable discharge event (CDE) characteristics are desired to be determined, and wherein the equivalent circuit value is selected from a group consisting of: inductance, capacitance, resistance, and impedance;
a connector configured to couple the at least one test element to leads of the cable;
a probe for detecting at least one of: voltage across or current through the at least one test element; and
a microprocessor or an oscilloscope coupled to the probe for collecting data from the probe, wherein the microprocessor or oscilloscope is physically on the PCB,
wherein the data collected from the probe includes at least one of: signal pulse waveform during a time period, signal magnitude, signal pulse width, polarity, and frequency of events,
wherein the at least one test element is tunable such that the at least one test element is configurable to match the equivalent circuit value in a predetermined frequency range,
wherein a plurality of test elements are used, and wherein each of the plurality of test elements is coupled to a unique pair of leads of the connector.

11. An audit device as recited in claim 10, wherein the frequency range is determined based on a frequency range where ESD, EOS and CD events are anticipated to occur.

12. An audit device, comprising:
a printed circuit board (PCB);
at least one test element coupled to the PCB, wherein the at least one test element is a resistor or a resistance-inductance-capacitance (RLC) circuit having an equivalent circuit value to a device that is normally connected to a cable and for which electrostatic discharge (ESD), electrostatic overstress (EOS), and/or cable discharge event (CDE) characteristics are desired to be determined, and wherein the equivalent circuit value is selected from a group consisting of: inductance, capacitance, resistance, and impedance;
a connector adapted for coupling the at least one test element to leads of the cable;
a probe for detecting at least one of: voltage across or current through the at least one test element; and
a microprocessor or an oscilloscope coupled to the probe for collecting data from the probe,
wherein the data collected from the probe includes at least one of: signal pulse waveform during a time period, signal magnitude, signal pulse width, polarity, and frequency of events,
wherein the at least one test element is tunable such that the at least one test element is configurable to match the equivalent circuit value in a predetermined frequency range;
wherein the microprocessor or oscilloscope is physically on the PCB.

* * * * *